(12) United States Patent
Zandian

(10) Patent No.: US 11,118,982 B2
(45) Date of Patent: Sep. 14, 2021

(54) SPECTROSCOPIC FOCAL PLANE ARRAY AND METHOD OF MAKING SAME

(71) Applicant: Teledyne Scientific & Imaging, LLC, Thousand Oaks, CA (US)

(72) Inventor: Majid Zandian, Calabasas, CA (US)

(73) Assignee: TELEDYNE SCIENTIFIC & IMAGING, LLC, Thousand Oaks, CA (US)

(*) Notice: Subject to any disclaimer, the term of this patent is extended or adjusted under 35 U.S.C. 154(b) by 0 days.

(21) Appl. No.: 16/987,194

(22) Filed: Aug. 6, 2020

(65) Prior Publication Data

US 2020/0363266 A1 Nov. 19, 2020

Related U.S. Application Data

(62) Division of application No. 15/697,934, filed on Sep. 7, 2017, now Pat. No. 10,801,895.

(51) Int. Cl.
| | |
|---|---|
| *H01L 27/00* | (2006.01) |
| *G01J 3/28* | (2006.01) |
| *G01J 5/20* | (2006.01) |
| *H04N 5/33* | (2006.01) |
| *H01L 21/02* | (2006.01) |
| *C23C 14/54* | (2006.01) |

(Continued)

(52) U.S. Cl.
CPC .............. *G01J 5/20* (2013.01); *C23C 14/027* (2013.01); *C23C 14/06* (2013.01); *C23C 14/48* (2013.01); *C23C 14/548* (2013.01); *G01J 3/2803* (2013.01); *H01L 21/0251* (2013.01); *H01L 21/02411* (2013.01); *H01L 21/02502* (2013.01); *H01L 21/02562* (2013.01); *H01L 21/02631* (2013.01); *H01L 27/14669* (2013.01); *H04N 5/332* (2013.01); *G01J 2005/202* (2013.01); *G01N 2021/1772* (2013.01); *G01N 2021/213* (2013.01); *G01N 2021/8416* (2013.01)

(58) Field of Classification Search
CPC ...................... H01L 21/0251; H01L 21/02562
See application file for complete search history.

(56) References Cited

U.S. PATENT DOCUMENTS

| | | |
|---|---|---|
| 5,610,413 A | 3/1997 | Fan et al. |
| 5,772,758 A | 6/1998 | Collins et al. |

(Continued)

OTHER PUBLICATIONS

Arkun, F. Erdem et al., "Characterization of HgCdTe Films Grown on Large-Area CdZnTe Substrates by Molecular Beam Epitaxy", Mar. 21, 2017, Journal of Electronic Materials, vol. 46, No. 9.

*Primary Examiner* — Dani Fox
(74) *Attorney, Agent, or Firm* — M.J. Ram and Associates

(57) ABSTRACT

A semiconductor material emitting device is positioned such that its output flux impinges on a substrate at a non-perpendicular angle, so as to grow a first epilayer which is linearly graded in the direction perpendicular to the growth direction. The linear grading can be arranged such that, for example, each row of pixels has a different cutoff wavelength, thereby making it possible to provide a spectroscopic FPA without the use of filters. The non-perpendicular angle and/or the flux intensity can be adjusted to achieve a desired compositional grading. A spectral ellipsometer may be used to monitor the composition of the epilayer during the fabrication process, and to control the intensity of the flux.

5 Claims, 3 Drawing Sheets

(51) Int. Cl.
    *H01L 27/146*    (2006.01)
    *C23C 14/02*     (2006.01)
    *C23C 14/06*     (2006.01)
    *C23C 14/48*     (2006.01)
    *G01N 21/17*     (2006.01)
    *G01N 21/84*     (2006.01)
    *G01N 21/21*     (2006.01)

(56) References Cited

U.S. PATENT DOCUMENTS

| | | | |
|---|---|---|---|
| 6,469,358 | B1 | 10/2002 | Martin |
| 6,657,194 | B2 | 12/2003 | Ashokan et al. |
| 6,803,557 | B1 * | 10/2004 | Taylor ............... H01L 27/14618 |
| | | | 250/208.1 |
| 6,967,345 | B1 | 11/2005 | Gunapala et al. |
| 7,214,598 | B2 | 5/2007 | Capewell et al. |
| 7,759,698 | B2 | 7/2010 | Ogura |
| 2005/0205758 | A1 | 9/2005 | Almeida |
| 2006/0138313 | A1 * | 6/2006 | Tennant ................. G01J 3/02 |
| | | | 250/226 |

* cited by examiner

SPECTROSCOPIC FOCAL PLANE ARRAY AND METHOD OF MAKING SAME

RELATED APPLICATIONS

This application is a divisional of application Ser. No. 15/697,934 to M. Zandian, filed Sep. 7, 2017.

BACKGROUND OF THE INVENTION

Field of the Invention

This invention relates generally to focal plane arrays (FPAs), and more particularly to FPAs with built-in spectroscopic capabilities, and methods of fabricating such FPAs.

Description of the Related Art

Imaging devices are often comprised of an array of pixels known as a focal plane array (FPA). Each pixel includes a photodetector, each of which is responsive to light over a particular range of wavelengths, with the output of each pixel being an average of the signal amplitude over the particular range.

However, in many applications, it is necessary to detect incoming light over a very narrow range of wavelengths, such as 8-10 μm. This is conventionally facilitated by placing a bandpass filter in front of the pixel array, which is designed to allow only light within the wavelength range of interest to pass.

While a bandpass filter works well when there is only one narrow wavelength range of interest, it is less practical when information is needed about multiple wavelength ranges. When this is the case, multiple bandpass filters can be deployed over the pixel array, with each filter responsible for passing a respective range of wavelengths. The pixel array is then scanned and multiple images produced, each covering a respective wavelength range. However, this requires the fabrication of multiple unique bandpass filters, each of which must be precisely positioned over the pixel array.

SUMMARY OF THE INVENTION

A FPA and a method of making same are presented, which provides spectroscopic functionality without the need for bandpass filters.

The present method results in a linearly graded epilayer on a semiconductor substrate. This method comprises providing a semiconductor substrate, providing a semiconductor material emitting device which outputs a flux having a predetermined composition and which creates epitaxial growth when directed at a substrate, and positioning the emitting device such that its output flux impinges on the substrate at a non-perpendicular angle, so as to grow a first epilayer on the substrate which is linearly graded in the direction perpendicular to the growth direction. The linear grading can be arranged such that, for example, each row of pixels has a different cutoff wavelength, thereby making it possible to provide a spectroscopic FPA without the use of filters.

The semiconductor material emitting device is preferably a molecular beam epitaxy (MBE) machine, which emits flux toward a semiconductor substrate comprising, for example, CdZnTe. The MBE machine might be arranged to, for example, emit CdTe flux from a first, non-perpendicular gun, and Hg flux from a second gun, to create a first epilayer having a composition of $Hg_{1-x}Cd_xTe$, with the value of 'x' varying with the linear grading. The non-perpendicular angle is adjusted to achieve a desired compositional grading across the first epilayer in the direction perpendicular to the growth direction. The intensity of the flux can also be adjusted to achieve a desired compositional grading. A spectral ellipsometer may be used to monitor the composition of the first epilayer during the fabrication process, and to control the intensity of the flux.

The method may further comprise positioning and using the semiconductor material emitting device to grow a second linearly graded epilayer above the first linearly graded epilayer, such that the second linearly graded epilayer is a base layer and the first linearly graded epilayer is a filter layer. The base and filter layers may be adapted for a row and column array of pixels, with the compositional grading of the base and filter layers differing such that the wavelength range to which each pixel is sensitive varies with the difference and with the pixel's position in the array.

These and other features, aspects, and advantages of the present invention will become better understood with reference to the following drawings, description, and claims.

DETAILED DESCRIPTION OF THE INVENTION

Figure 1:
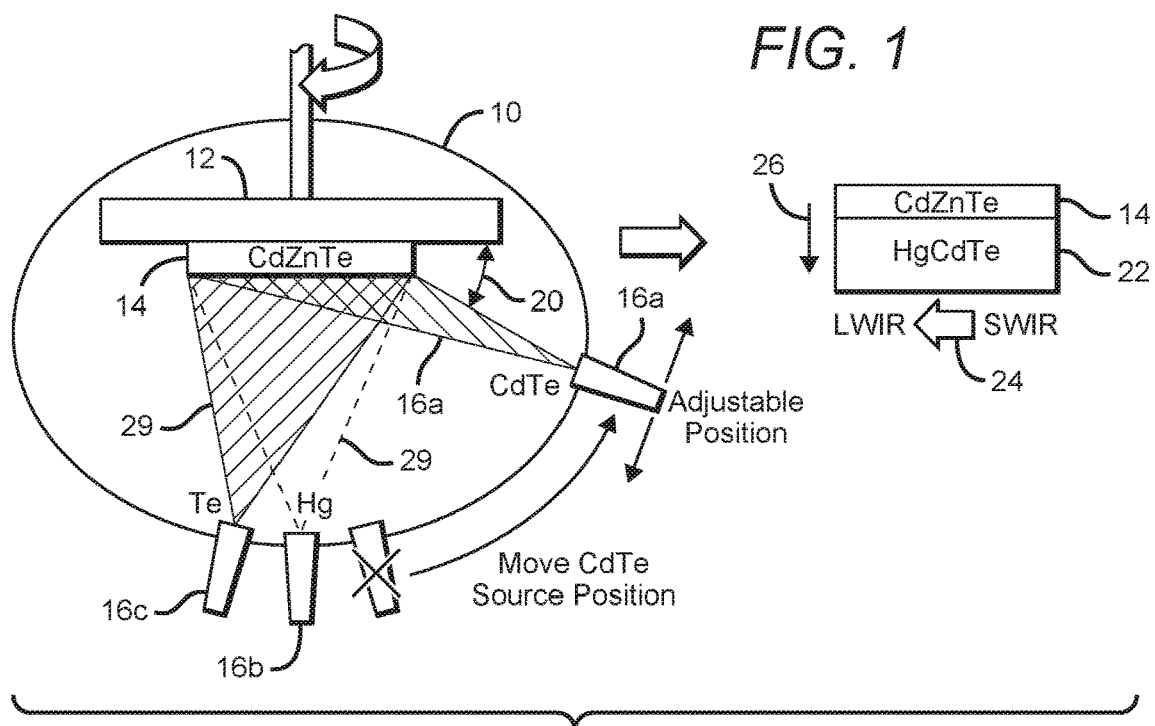
FIG. 1 is a diagram illustrating the present method.

The present method of providing a linearly graded epilayer on a semiconductor substrate is illustrated in FIG. 1. The method would typically be carried in a vacuum chamber 10 which contains a semiconductor die holder 12. A semiconductor substrate 14 on which a linearly graded epilayer is to be grown is mounted to holder 12.

The method further requires that a semiconductor material emitting device 16a be provided, which outputs a flux 18 having a predetermined composition and which creates epitaxial growth when directed at a substrate. The semiconductor material emitting device, suitably at least one gun of a molecular beam epitaxy (MBE) machine, is positioned such that the flux emitted from at least one output of the device impinges on semiconductor substrate 14 at a non-perpendicular angle 20, to grow a first epilayer 22 on the substrate which is linearly graded in the direction 24 perpendicular to the growth direction 26.

The present method could be used to produce a linearly graded epilayer on any substrate. When provided on an epilayer for an FPA, the semiconductor substrate 14 suitably comprises CdZnTe, and the flux 18 suitably comprises CdTe. These materials would be particularly well-suited when the resulting linearly graded epilayer/semiconductor substrate forms part of an IR pixel array.

In a typical application, the semiconductor material emitting device includes additional outputs capable of emitting materials in a flux toward substrate 14. In the exemplary illustration shown in FIG. 1, CdTe flux 18 is emitted from first output 16a, a Hg flux 28 is emitted from a second output 16b, and a Te flux 29 is emitted from a third output 16c; additional outputs might also be employed. When so arranged, the first epilayer 22 has a composition of $Hg_{1-x}Cd_xTe$, with the value of 'x' varying with the linear grading. Outputs 16b and 16c are suitably provided by respective guns of an MBE machine. The end of substrate 14 furthest from output 16a will receive less CdTe flux, such that 'x' will be lower; similarly, the end of the substrate closest to output 16a will receive more flux, and 'x' will be higher. When the substrate/epilayer is used as part of a pixel array, a lower 'x' correlates with a longer cutoff wavelength, and a higher 'x' correlates with a shorter cutoff wavelength. In this way, the cutoff wavelength is made to vary linearly across the array in the direction 24 perpendicular to the growth direction 26. This can enable a pixel array to be, for example, sensitive to SWIR at one end (the right end in FIG. 1), MWIR near the middle, and LWIR at the opposite end (the left end in FIG. 1).

For a conventional pixel array, holder 12 must be rotated during fabrication, to achieve an even distribution of flux material over substrate 14. As the objective of the present method is a linearly graded epilayer, no rotation is required.

In a conventional pixel array, with an even distribution of flux material, all pixels must be able to detect the longest wavelength of interest. This can result in a compromised signal-to-noise ratio (SNR), as dark current increases with longer wavelengths. The present method can improve SNR, as the linear grading results in some pixels having a lower cutoff wavelength.

The compositional grading across the first epilayer can be controlled in several ways. One control technique is to adjust the non-perpendicular angle 20 as needed to achieve a desired compositional grading across first epilayer 22 in the direction 24 perpendicular to the growth direction 26. Alternatively, or in addition, the intensity of the flux 18 can be adjusted to achieve a desired compositional grading.

Note that when the semiconductor material emitting device has multiple outputs, it is not essential that any one particular output be positioned at a non-perpendicular angle 20. For example, in FIG. 1, CdTe output 16a might be positioned at a perpendicular angle, and Te output 16c might instead be positioned at a non-perpendicular angle. Yet another possibility is to have more than one output positioned at a non-perpendicular angle. For example, both CdTe and Te outputs could be positioned at a non-perpendicular angle, with one or more other outputs directed at the center of substrate 14. One, more than one, or all of the output fluxes could be adjusted to achieve a desired composition grading.

Note that, as mentioned above, epilayer growth techniques other than MBE might be employed with the present method. For example, MOCVD or a modified MOCVD system might alternatively be used.

The present method may also employ a spectral ellipsometer (not shown) to monitor the composition (i.e., the 'x' value) of the first epilayer, typically at the epilayer's center. The ellipsometer can also be used to provide real-time control of flux intensity in order to achieve a desired composition.

The present method enables the fabrication of spectroscopic FPAs, or a multi-color imaging SCA (Sensor Chip Assembly), without the need for filters. This serves to reduce the mass and complexity of an optical system requiring spectroscopic capabilities. By creating a linearly graded epilayer as discussed above, FPA bandwidth and resolution can be made selectable; wavelength resolution of 5-10 nm is achievable.

As noted above, for a pixel array which employs an epilayer fabricated as discussed herein, cutoff wavelength can be made to vary linearly across the array in the direction 24 perpendicular to the growth direction 26. Thus, when the first epilayer is adapted for a row and column array of pixels, each pixel has an associated cutoff wavelength which varies with the linear grading. For example, an array can be fabricated for which each row of pixels has a different cutoff wavelength.

As an example, assuming that a CdTe output is positioned at a non-perpendicular angle, the row closest to the CdTe gun would have the highest 'x' value, and therefore the shortest cutoff. As such, the first row might be able to detect light over a range of 2-5 µm. The next row would have a lower 'x', and therefore a longer cutoff, so the second row might detect light over a range of, for example, 2-6 µm. The last row would have the lowest 'x', and therefore the longest cutoff. Thus, the last row might detect light over a range of, for example, say 2-16 µm.

Each row of pixels will have the same minimum wavelength (2 µm in the example above). The minimum without substrate removal for a HgCdTe layer would be about 850 nm, because that is where the substrate cutoff is. The grading does not affect the minimum because any composition of HgCdTe would see all the light up to the cutoff wavelength. If the substrate is removed, the minimum wavelength would be sensitive to light even below 850 nm.

Figure 2:
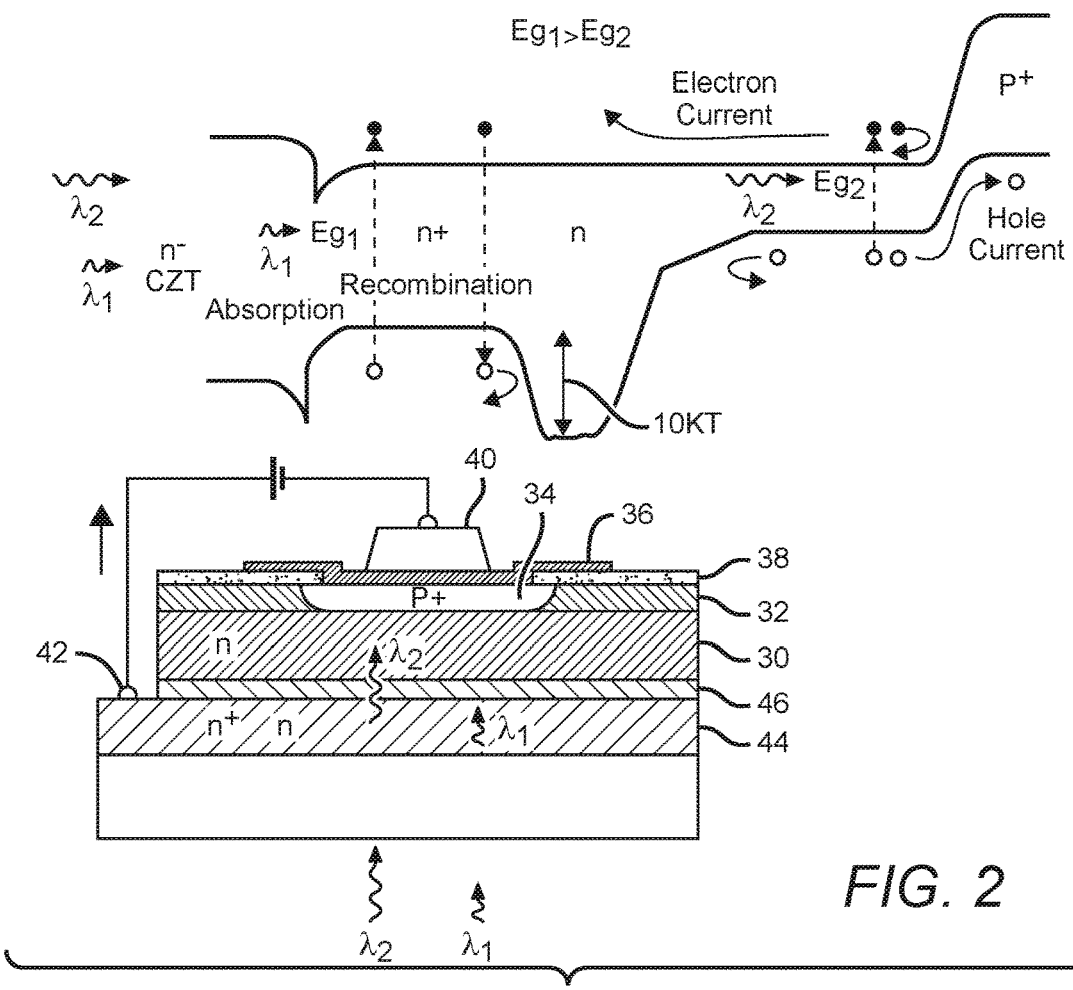
FIG. 2 is a sectional view of a pixel as might be produced using the present method, and an energy diagram illustrating the pixel's operation.

In practice, a first epilayer fabricated as described herein requires further processing to produce the semiconductor junctions required for an array of pixels. An exemplary pixel is shown in FIG. 2. The pixel includes a n-type base layer 30, linearly graded as described herein, with a cap layer 32 on the base layer. A $p^+$ region 34 is formed in cap layer 32 to form a p-n junction with n-type base layer 30. A pad metal 36 which is partly on a passivation layer 38 can provide a first electrical contact 40 to the pixel; a second electrical contact 42 is suitably made at or below n-type base layer 30. The $p^+$ region 34 can formed in a number of different ways, with ion implantation being preferred.

The present method may further comprise positioning and using a non-perpendicular semiconductor material emitting device to grow a second linearly graded epilayer above the first linearly graded epilayer. This is illustrated in FIG. 2, in which base layer 44 is a second linearly graded epilayer, and a first linearly graded epilayer 30 serves as a filter layer; a barrier layer 46 is suitably included between base layer 44 and filter layer 30. FIG. 2 also includes an energy diagram illustrating the operation of the pixel structure for incoming light at two different wavelengths $\lambda_1$ and $\lambda_2$.

Figure 3:
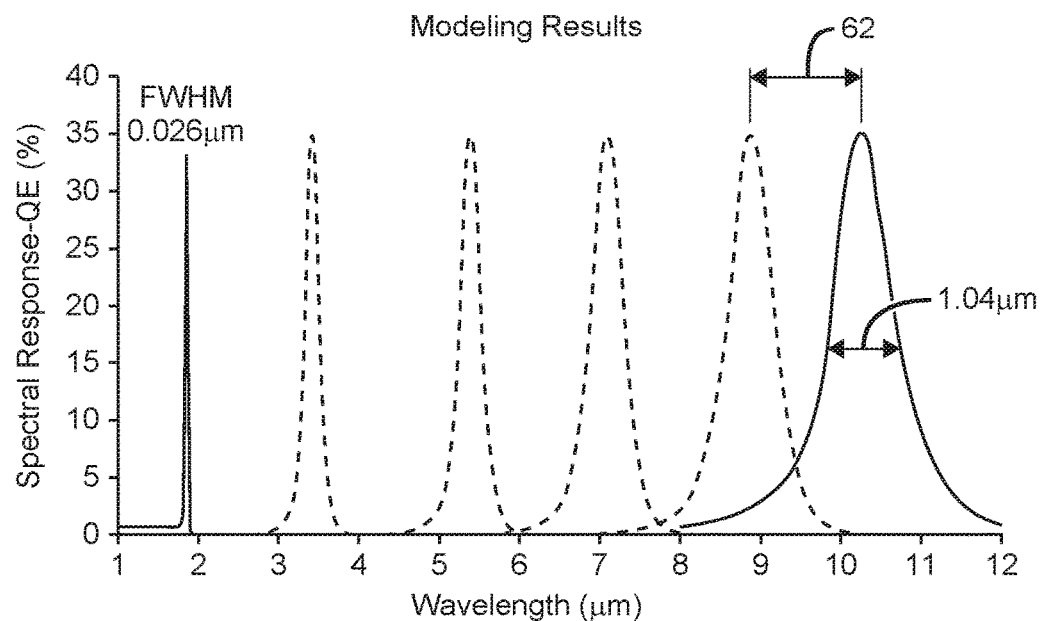
FIG. 3 is a sectional view of a pixel array as might be produced using the present method, and a corresponding Spectral Response plot.
Figure 3:
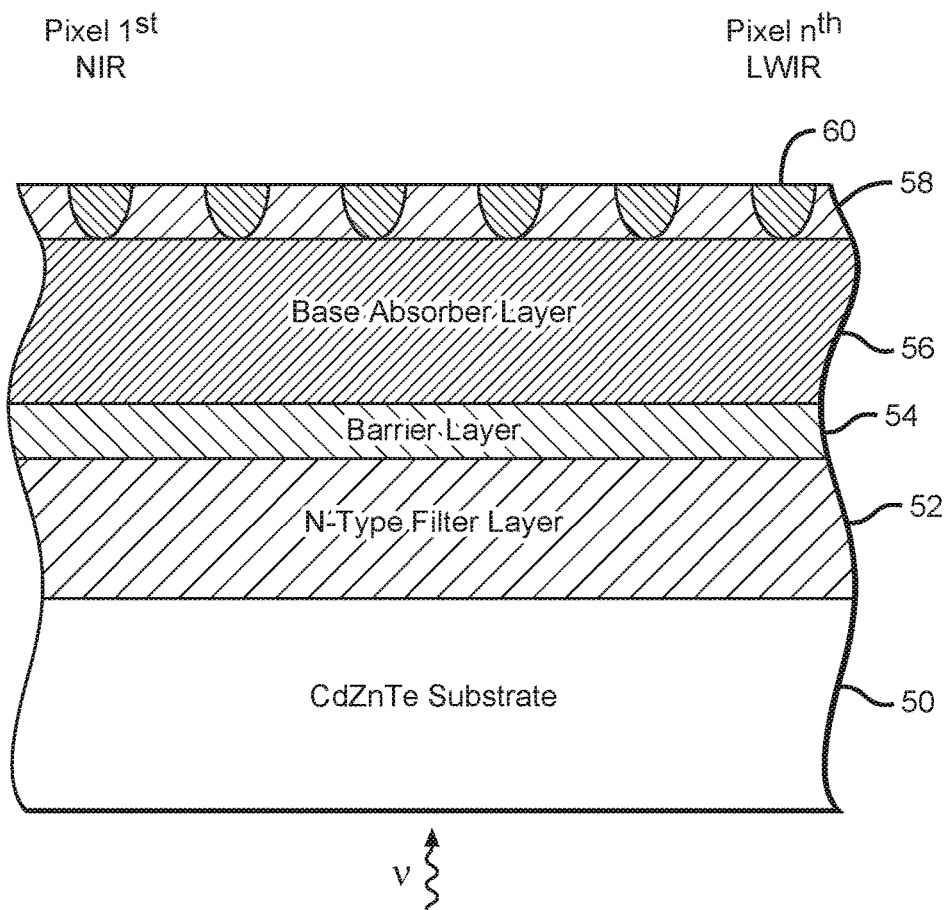

As noted above, both base and filter layers can be linearly graded as described herein, with individual pixels fabricated by forming p-n junctions in the base layer. Another illustration of this is shown in FIG. 3. In this exemplary embodiment, the pixel structure comprises a CdZnTe substrate 50, a linearly graded N-type filter layer 52 on the substrate, a barrier layer 54 on the filter layer, a linearly graded base absorber layer 56 on the barrier layer, and a cap layer 58 on the base absorber layer. P-n junctions 60 are formed, preferably via implantation of a material such as arsenic. A plot above the structure diagram models the spectral response that might be achieved for each of the pixels shown. Wavelength resolution 62 is given by $\Delta\lambda/N$, where $\Delta\lambda$ is the composition grading across the epilayer, and N is the number of pixels across the FPA in the grading direction. The modeling parameters for the plot are as follows:
640×480 (composition grading in 480 direction)
$\Delta X_{(filler\ layer\ to\ base\ layer)}$=0.004
$\Delta X_{(across\ layer)}$=0.43 (NIR to LWIR)
Background radiation=300K @ F2
Pixel pitch=30 µm
Base layer thickness=10 µm
Barrier height=10 KT
Filter layer thickness=10 µm
N-type doping level=7 E14 cm$^{-3}$
$\Delta \lambda JN$=18 nm Thus, for these modeling parameters, the wavelength resolution is 18 nm. For a 2 k×2 k array, the wavelength resolution will be <5 nm. Full Width at Half Maximum (FWHM) and peak QE are proportional to $\Delta X_i$, where $\Delta X_i$ is the composition difference between the filter layer and the base layer.

In this way, linearly graded base and filter layers can be adapted for a row and column array of pixels, with the compositional grading of base and filter layers differing such that the wavelength range to which each pixel is sensitive varies with the difference, and with the pixel's position in the array.

Figure 4:
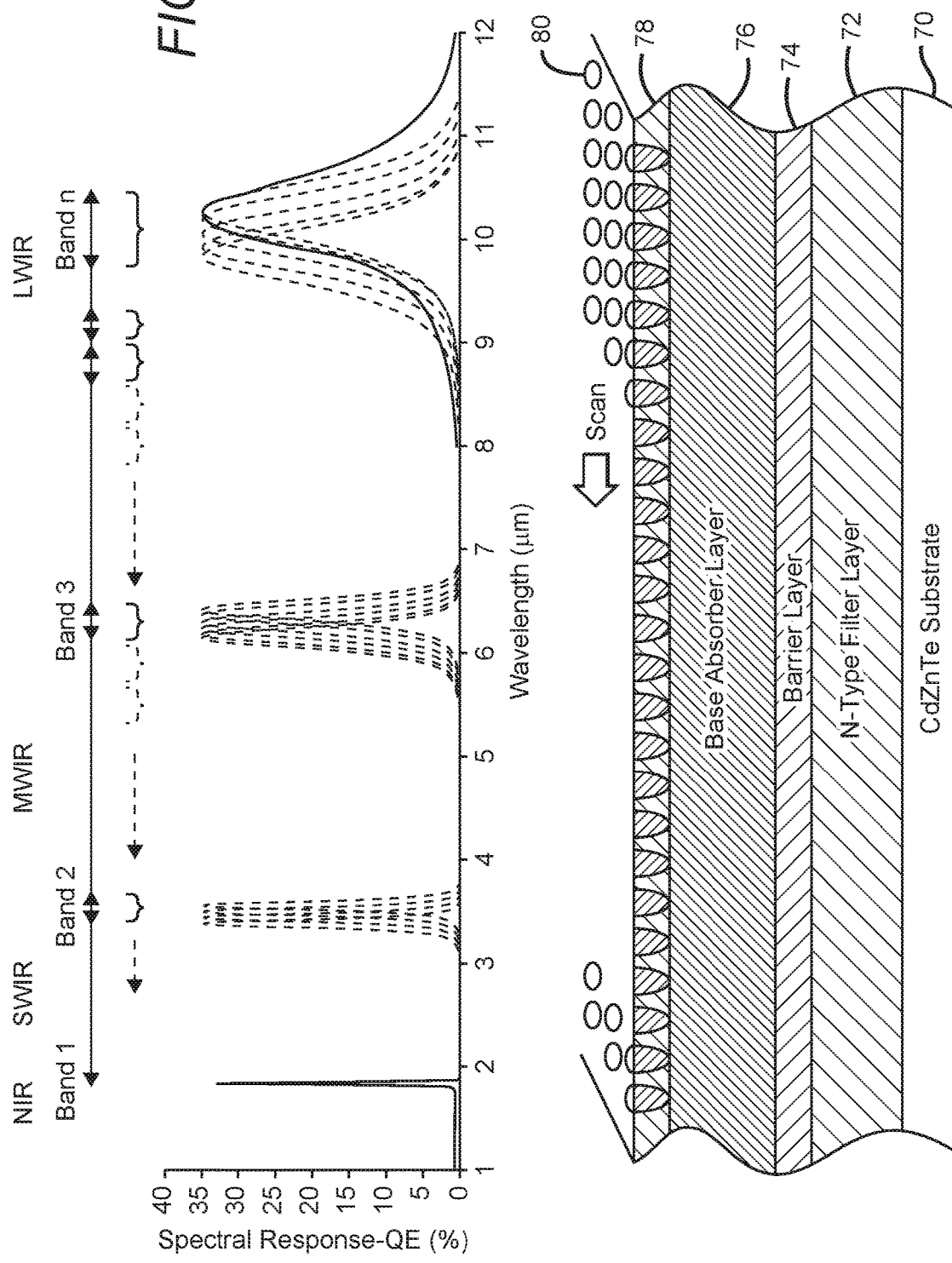
FIG. 4 is a sectional view of a pixel array as might be produced using the present method, and a corresponding Spectral Response plot.

The ability to provide a spectroscopic FPA using linearly graded epilayers as described herein is further illustrated in FIG. 4, which includes both structure and Spectral Response diagrams. As above, this exemplary device comprises a CdZnTe substrate 70, N-type filter layer 72, barrier layer 74, base absorber layer 76, cap layer 78, and junctions 80, to form a row and column array of pixels. Both filter layer 72 and base absorber layer 76 are linearly graded as described herein. Wavelength resolution/bandwidth can be built into the array design, or can be defined in software.

With a pixel array as described herein, the same image data/scan can be used to generate images from different bands, and/or with different wavelength resolutions. For example, assume that a pixel array in accordance with the present invention has acquired a data set of a particular scene from 2 to 10 µm, with a resolution of 10 nm; i.e., the data set includes an image at 2.0 µm, another image of the same scene at 2.01 µm, another at 2.02 µm, and so on up to 10 µm. To see an image between, for example, 3.0 and 4.0 µm, to look for the signature of a specific gas, for example, all of the images from 3.0 µm to 4.0 µm are averaged. Another user can use the same 2-10 µm data set to look for another gas having a signature between, for example, 3.7 and 3.8 µm, by averaging the images between 3.7 and 3.8 µm. In this way, a large number of combinations can be achieved with the same data set, without the need for different filter sets, or for another mission to go to the same scene to take additional data. One data set can be used in any desired way, with almost infinite possibilities, such that any gas or object with a unique signature can be extracted from one data set.

Very high operability can be provided due to built-in pixel redundancy in each band. Band gap engineering allows fabrication of very high resolution (<5 nm) spectroscopic FPAs.

If the linear grading is performed such that the cutoff frequencies across the filter layer differ slightly from the cutoff frequencies across the base layer, each pixel can be made to have a very narrow response band defined by the difference. If no filter layer is used, obtaining a similar narrow band response requires that pixel subtraction be performed.

The present method might also be employed to obtain an array having a broad response. Here, only a single linearly graded epilayer is fabricated as described herein, which would then provide imaging data at many different wavelengths. This approach has the effect of providing many arrays with many cutoff wavelengths in one array.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A detector comprising a row and column array of pixels, said detector comprising:
   a semiconductor substrate; and
   a first epilayer on said substrate which is linearly graded in the direction perpendicular to the growth direction.

2. The detector of claim 1, wherein said semiconductor substrate comprises CdZnTe and said first epilayer has a composition of Hg1-xCdxTe, with the value of 'x' varying with said linear grading.

3. The detector of claim 1, each of said pixels having an associated cutoff wavelength which varies with said linear grading, said linear grading arranged such that each row of pixels has a different cutoff wavelength.

4. The detector of claim 1, further comprising a second linearly graded epilayer above said first linearly graded epilayer, said first linearly graded epilayer being a base layer and said second linearly graded epilayer being a filter layer.

5. The detector of claim 4, wherein the compositional grading of said base and filter layers differs such that the wavelength range to which each pixel is sensitive varies with said difference and with said pixel's position in said array.

* * * * *